(12) United States Patent
Liao et al.

(10) Patent No.: US 11,775,017 B2
(45) Date of Patent: Oct. 3, 2023

(54) BENDABLE DISPLAYS

(71) Applicant: Hewlett-Packard Development Company, L.P., Spring, TX (US)

(72) Inventors: Super Liao, Taipei (TW); Kuan-Ting Wu, Taipei (TW); Hsing-Hung Hsieh, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 17/911,568

(22) PCT Filed: Apr. 3, 2020

(86) PCT No.: PCT/US2020/026528
§ 371 (c)(1),
(2) Date: Sep. 14, 2022

(87) PCT Pub. No.: WO2021/201877
PCT Pub. Date: Oct. 7, 2021

(65) Prior Publication Data
US 2023/0104552 A1    Apr. 6, 2023

(51) Int. Cl.
*G09G 5/00* (2006.01)
*G06F 1/16* (2006.01)
*H10K 85/10* (2023.01)
*H10K 102/00* (2023.01)
*H10K 77/10* (2023.01)
(Continued)

(52) U.S. Cl.
CPC .......... *G06F 1/1652* (2013.01); *G06F 1/1647* (2013.01); *H10K 85/111* (2023.02); *G09G 3/3208* (2013.01); *G09G 3/36* (2013.01); *H10K 77/111* (2023.02); *H10K 2102/311* (2023.02)

(58) Field of Classification Search
CPC .... G06F 1/1641; G06F 1/1652; G06F 1/1681; G06F 2203/04102; G09G 3/36; G09G 3/3208; G09G 2380/02; G09F 9/301; H10K 77/111; H10K 85/111; H10K 2102/311
See application file for complete search history.

(56) References Cited

U.S. PATENT DOCUMENTS 9,164,547 B1 * 10/2015 Kwon .................. G06F 1/1652
9,429,999 B2    8/2016 Lee et al.
(Continued)

FOREIGN PATENT DOCUMENTS

CN    109003540 A    12/2018
CN    109147573 A    1/2019
(Continued)

*Primary Examiner* — Joe H Cheng
(74) *Attorney, Agent, or Firm* — HP Inc. Patent Department

(57) ABSTRACT

The present disclosure is drawn to bendable displays for electronic devices. In one example, a first display region including a glass panel that is rigid, the glass panel including a first interlocking edge. A second display region can include a plastic panel that is bendable, the plastic panel including a second interlocking edge that is shaped to inversely correspond with the first interlocking edge. An interlock zone where the first interlocking edge can be joined with the second interlocking edge such that the first display region and the second display region form a continuous display panel that is bendable at a location along the second display region.

15 Claims, 10 Drawing Sheets

(51) Int. Cl.
*G09G 3/3208* (2016.01)
*G09G 3/36* (2006.01)

(56) References Cited

U.S. PATENT DOCUMENTS

| | | | |
|---|---|---|---|
| 9,504,170 B2 | 11/2016 | Rothkopf et al. | |
| 9,640,763 B2* | 5/2017 | Song | H10K 85/111 |
| 9,923,157 B2 | 3/2018 | Yoon et al. | |
| 10,140,018 B2 | 11/2018 | Kim et al. | |
| 10,359,809 B2* | 7/2019 | Kwak | G06F 3/04886 |
| 10,575,415 B2* | 2/2020 | Shin | G06F 1/1681 |
| 11,334,123 B2* | 5/2022 | Kim | E05D 3/18 |
| 2007/0117600 A1* | 5/2007 | Robertson | G06F 1/1681 |
| | | | 455/575.1 |
| 2013/0216740 A1* | 8/2013 | Russell-Clarke | G06F 1/1616 |
| | | | 219/121.72 |
| 2014/0123436 A1* | 5/2014 | Griffin | G06F 1/1681 |
| | | | 16/221 |
| 2014/0226275 A1* | 8/2014 | Ko | G06F 1/1652 |
| | | | 361/679.27 |
| 2015/0277496 A1* | 10/2015 | Reeves | G09F 9/301 |
| | | | 345/1.2 |
| 2016/0187935 A1* | 6/2016 | Tazbaz | H04M 1/0216 |
| | | | 361/679.55 |
| 2017/0003793 A1* | 1/2017 | Gao | G06F 3/1431 |
| 2017/0060188 A1 | 3/2017 | Han et al. | |
| 2018/0164852 A1* | 6/2018 | Lim | H04M 1/0214 |
| 2019/0036068 A1* | 1/2019 | Kim | H10K 59/87 |
| 2020/0139672 A1 | 5/2020 | Cao | |
| 2020/0170127 A1* | 5/2020 | Kim | H05K 5/0226 |

FOREIGN PATENT DOCUMENTS

| | | |
|---|---|---|
| CN | 209199502 U | 8/2019 |
| CN | 110288908 A | 9/2019 |
| CN | 209525864 U | 10/2019 |

* cited by examiner

BENDABLE DISPLAYS

BACKGROUND

The use of personal electronic devices of all types continues to increase. Cellular phones, including smartphones, have become nearly ubiquitous. Tablet computers have also become widely used in recent years. Portable laptop computers continue to be used by many for personal, entertainment, and business purposes. For portable electronic devices in particular, much effort has been expended to make these devices more useful and more powerful while at the same time making the devices smaller, lighter, and more durable. Most personal electronic devices have a display. The display may be bendable. Bendable displays may be unstable during user interactions.

DETAILED DESCRIPTION

Figure 1:
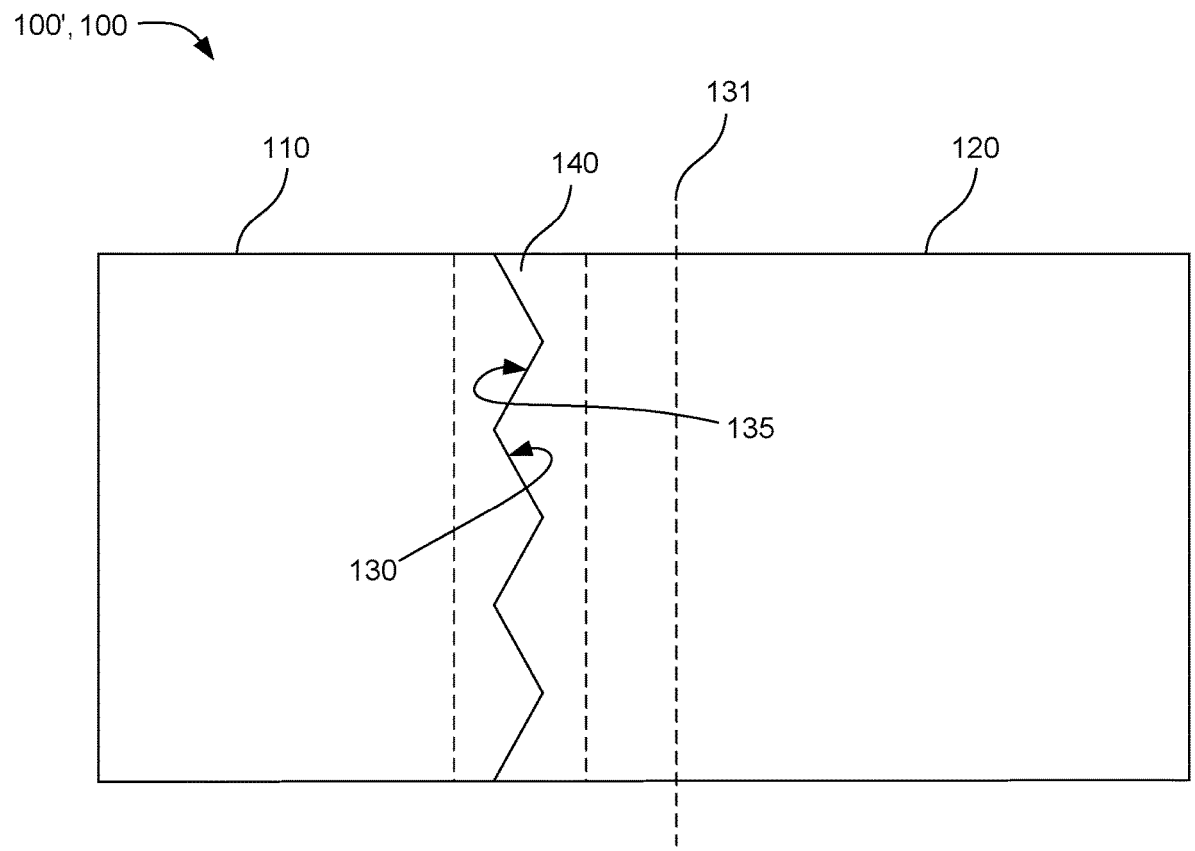
FIG. 1 illustrates an example bendable display for an electronic device in accordance with the present disclosure.

The present disclosure describes bendable displays for electronic devices. In some instances, a personal electronic device with a bendable display may be bent such that a lower portion of the device rests on a flat surface acting as a base and a second portion of the device is in an upright position and is supported by the first portion. In such a configuration, the bendable display may be unstable, may shift during use, and may be subjected to vibrations during user interactions with the display. To address this issue, the present disclosure provides a first display region that is rigid to provide stability to the first portion or base of the device, and furthermore, the first display region is interlocked with a second display region that is bendable.

In one example, a bendable display for an electronic device can include a first display region including a glass panel that is rigid, the glass panel including a first interlocking edge. The bendable display can further include a second display region including a plastic panel that is bendable, the plastic panel including a second interlocking edge that is shaped to inversely correspond with the first interlocking edge. The bendable display can further include an interlock zone where the first interlocking edge is joined with the second interlocking edge such that the first display region and the second display region form a continuous display panel that is bendable at a location along the second display region. A display substrate can include a second glass panel and a second plastic panel joined by a second interlock zone. An electronic display assembly can be supported by the display substrate, the electronic display assembly can include a sub-assembly with conductive layer attached to an emissive layer, the electronic display assembly further including a cathode layer and an anode layer positioned on opposing sides of the sub-assembly. The glass panel can be over a first portion of the electronic display assembly and the plastic panel can be over a second portion of the electronic display assembly, and the second portion of the electronic display assembly is also bendable at the location along the second display region. The plastic panel can include polyethylene terephthalate (PET), polyester, polyethylene naphthalate (PEN), polycarbonate (PC), polyethersulfone (PES), polycyclic olefin (PCO), e.g., or poly cyclic olefins, polyimide (PI), polyarylate, polystyrene, polymethyl methacrylate (PMMA), or a combination thereof. The glass panel has a thickness from about 0.1 mm to about 0.8 mm. The plastic panel has a thickness from about 10 μm to about 0.8 mm. The first interlocking edge or the second interlocking edge can have cross-sectional interlocking shape including a semi-circle, a semi-triangle, a semi-square, a semi-oval, a semi-trapezoids, a semi-rectangle, a semi-pentagon, a semi-hexagon, or a combination thereof. The glass panel can be joined to the plastic panel at the interlock zone using an optical clear adhesive. The bendable display can be a liquid crystal display (LCD) or an organic light emitting diode (OLED) display. The bendable display can be encased in a cover that is capable of articulating at the location along the second display region.

In one example, an electronic device can include an electronic component and a bendable display electronically integrated with the electronic component. The bendable display can include a first display region including a glass panel that is rigid, the glass panel including a first interlocking edge. The bendable display can further include a second display region including a plastic panel that is bendable, the plastic panel including a second interlocking edge that shaped to inversely correspond with the first interlocking edge. The bendable display can further include an interlock zone where the first interlocking edge is joined with the second interlocking edge such that the first display region and the second display region form a continuous display panel that is bendable at a location along the second display region. The electronic device can be a television, monitor, laptop, tablet computer, smartphone, or e-reader. The bendable display can be a liquid crystal display (LCD) or an organic light emitting diode (OLED) display.

In one example, a method of making a bendable display includes forming a first display region including a glass panel that is rigid, the glass panel including a first interlocking edge. The method can further include forming a second display region comprised of a plastic panel that is bendable, the plastic panel including a second interlocking edge that is shaped to inversely correspond with the first interlocking edge. The method can further include joining the first interlocking edge with the second interlocking edge to form a continuous display panel that is bendable at a location along the second display region. The method can further include forming the first interlocking edge, the second interlocking edge, or both by isothermal heating using an infrared lamp and travel control molding in a chamber.

It is noted that when discussing the cover, the electronic device, or the method of manufacturing the cover, such discussions of one example are to be considered applicable to the other examples, whether or not they are explicitly discussed in the context of that example. Thus, in discussing a first display region or second display region in the context of the bendable display, such disclosure is also relevant to and directly supported in the context of the electronic device, the method of making the bendable display, and vice versa.

Bendable Displays for Electronic Devices

The present disclosure describes bendable displays for electronic devices that can provide a firm and steady base for the electronic device when the electronic device is bent into a configuration resembling a laptop and placed on a surface. The bendable display can include a first display region that is composed of glass and is rigid. The bendable display can include a second display region that is composed of plastic and is bendable or flexible. The second display region may be larger than the first display region. Thus the electronic device may be bent at a center line that would be in the second display region. The glass material may be heavier than the plastic material. Thus a first display region may be heavier than the second display region and may provide a heavier base for the electronic device in a configuration resembling a laptop as compared to an electronic device that has a display composed of a uniform material. The heavier first display region also prevents the electronic device from shifting while being used in a configuration resembling a laptop. For example, when the second display region is in an upright position and is supported by the first display region on a surface, a user may touch the second display region. If the first display region is heavier than the second display region then the electronic device will resist shifting or vibrating while the user is touching the second display region.

The first display region and the second display region may be joined together at an interlock zone to form one continuous display panel. The interlock zone may provide seamless continuous display panel such that the user experience is not interrupted. The electronic device can be, but is not limited to a television, monitor, laptop, tablet computer, smartphone, or e-reader.

FIG. 1 shows an example bendable display 100/display substrate 100' for an electronic device. The bendable display can be a liquid crystal display (LCD) or an organic light emitting diode (OLED) display. The bendable display can include a first display region 110. The first display region can be composed of a glass panel that is rigid. The glass panel may have a first interlocking edge 130. The bendable display can include a second display region 120 that can be composed of a plastic panel and is bendable or flexible. The plastic panel may have a second interlocking edge 135 that is shaped to inversely correspond with the first interlocking edge. Thus the first interlocking edge may contact and join the second interlocking edge and form an interlock zone 140. The first interlocking edge and the second interlocking edge can be formed using a variety of shapes or patterns. The shapes or patterns may be repeating or non-repeating. The interlock zone 140 is depicted in FIG. 1 between two dotted lines. The interlock zone forms one continuous display panel formed from the first display region and the second display region. The display substrate 100' can include a second glass panel and a second plastic panel joined by a second interlock zone 140.

The first display region 110 and the second display 120 region may be joined together using an adhesive. The adhesive can be an optical clear adhesive. For example, the adhesive may be composed of: alkyl acrylates, isosorbide acrylate (ISA), butyl acrylate, hexyl acrylate, 2-ethylhexyl acrylate, polyacrylate, alkyl (meth)acrylate, polycarbonate, silicone, polyester, acrylic, or a combination thereof. The adhesive and the interlock zone may not be visible to a user.

FIG. 1 depicts the first display region 110 as being smaller than the second display region 120. As such, in this specific example, a center line 131 falls in the second display region. The center line may divide the bendable display 100/display substrate 100' down the geometrical middle of the bendable display. The second display region can be bendable. Thus, the bendable display may be bent at the center line 131. The bendable display may also be bent or flexed at any other location on the second display region.

The first display region 110 may be composed of glass. The glass may be a cover glass that is intended for a user to touch and interact with. The glass may be composed of indium tin oxide (ITO) glass. ITO is a ternary composition of indium, tin and oxygen in varying proportions. Depending on the oxygen content, ITO can either be described as a ceramic or alloy. ITO can be encountered as an oxygen-saturated composition with a formulation of 74% In, 18% $O_2$, and 8% Sn by weight. ITO can be transparent and colorless in thin layers. ITO can be electrically conductive and optically transparent. The glass panel can have a thickness from about 0.1 mm to about 0.8 mm.

The second display region 120 can include a plastic panel. The plastic panel can be composed of a material that includes polyethylene terephthalate (PET), polyester, polyethylene naphthalate (PEN), polycarbonate (PC), polyethersulfone (PES), polycyclic olefin (PCO), e.g., a cyclic olefin polymer, polyimide (PI), polyarylate, polystyrene, polymethyl methacrylate (PMMA), or a combination thereof. The plastic panel can have a thickness from about 10 µm to about 0.8 mm.

Figure 2A:
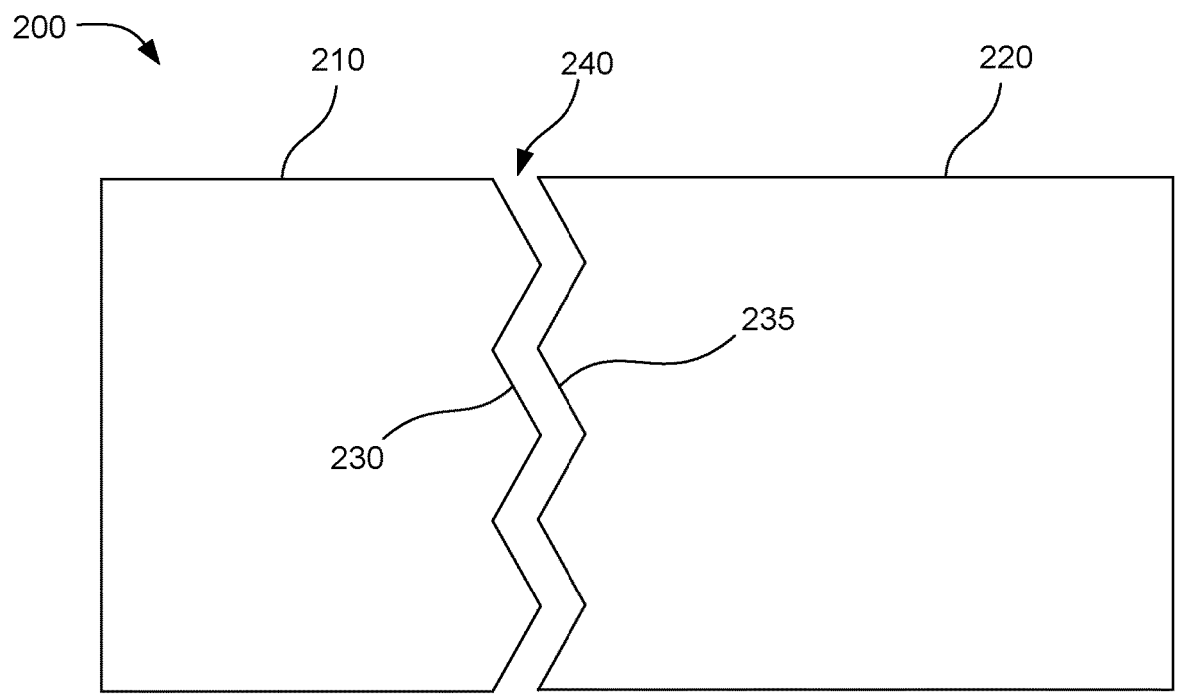
FIGS. 2A-D illustrate examples of interlocking shapes for bendable displays in accordance with the present disclosure.
Figure 2B:
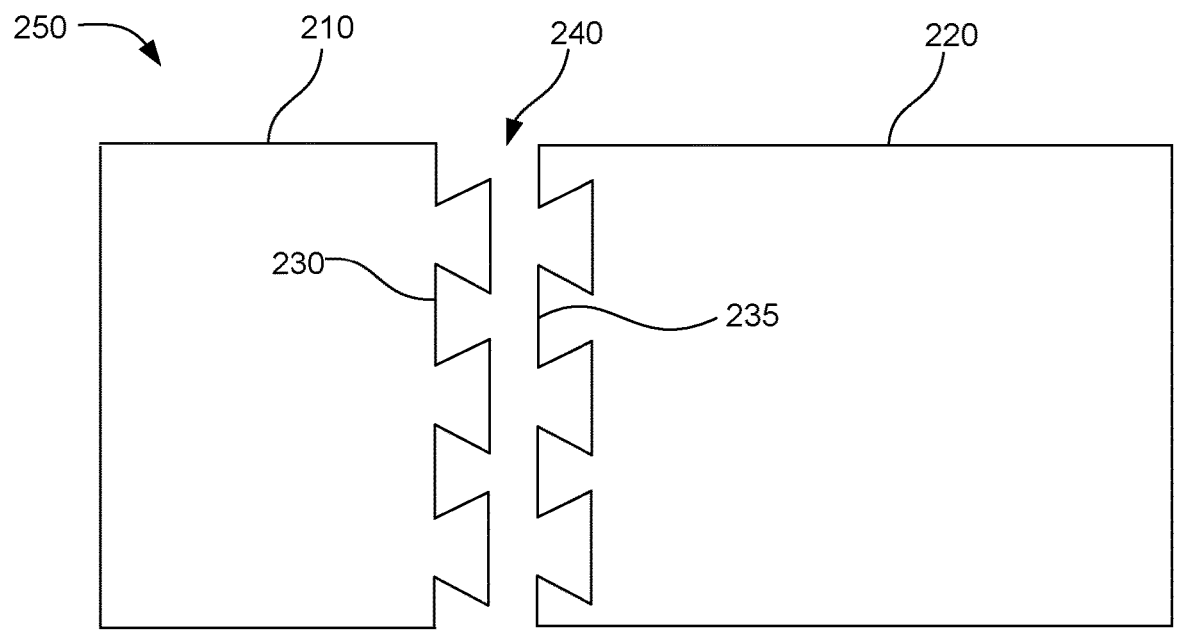
Figure 2C:
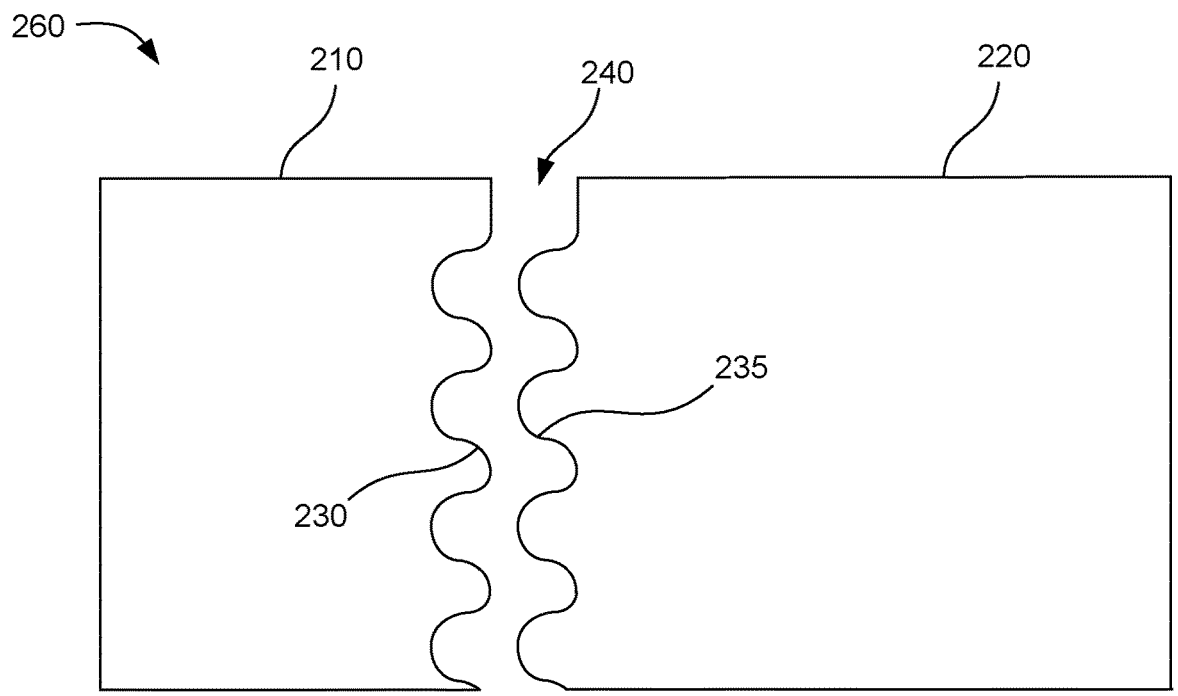
Figure 2D:
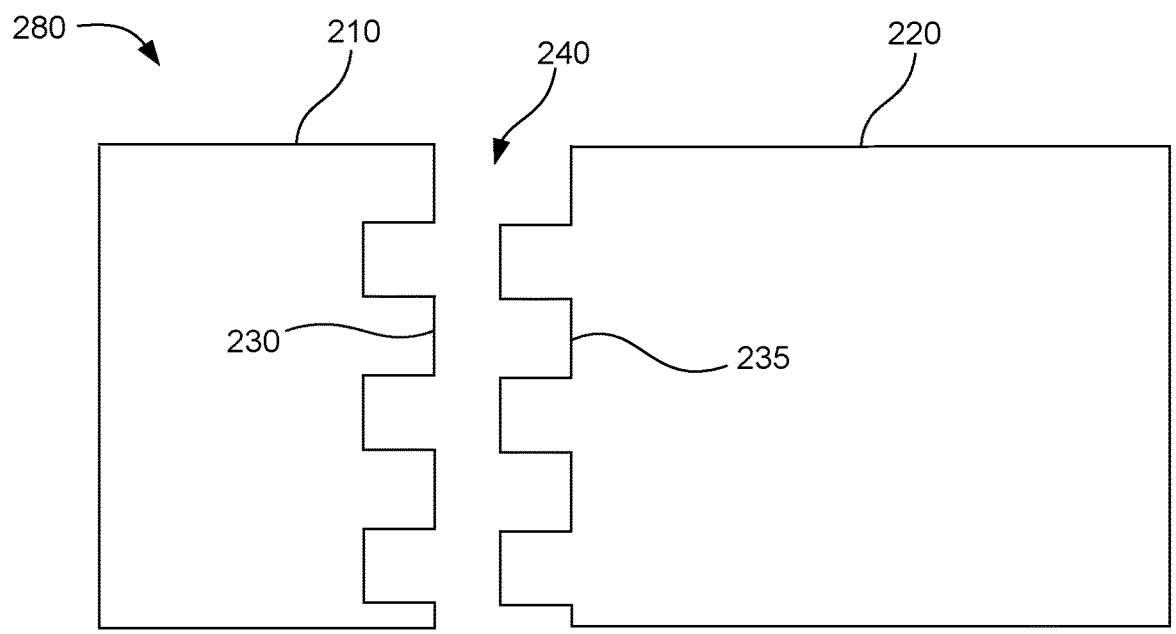

FIGS. 2A-2D depict various interlocking edges. The interlocking edge shapes and patterns depicted in FIGS. 2A-2D are depicted as uniform and repeating. However, the shapes at the interlock zone 240 of the first display region 210 and the second display region 220 may or may not be continuous or repeating. For example, different non-repeating shapes can be used along the first interlocking edge 230 and the second interlocking edge 235. The shapes of FIGS. 2A-2D can be combined at the interlock zone to become a tight joint that is adhered together in one example. In more specific detail, FIG. 2A depicts bendable display 200 with the first display region and the second display region separated from one another, and which can be joined together a continuous display panel. The first interlocking edge and the second interlocking edge of FIG. 2A are depicted as having an interlocking shape than can be described as triangular, or more specifically, semi-triangular or a pointed shape. FIG. 2B depicts a bendable display 250 as having an interlock zone with edge shapes that can be described as semi-trapezoid. This type of interlocking shape at the respective edges can sometimes referred to a dovetail joint. FIG. 2C depicts a bendable display 260 as having an interlock zone with inversely configured semi-circular edge shapes. FIG. 2D depicts a bendable display 280 as having an interlocking zone with semi-square or semi-rectangular edge shapes at the respective display regions. Other shapes can include for the interlocking edges can include a semi-oval, a semi-pentagon, a semi-hexagon, or other shapes.

Figure 3:
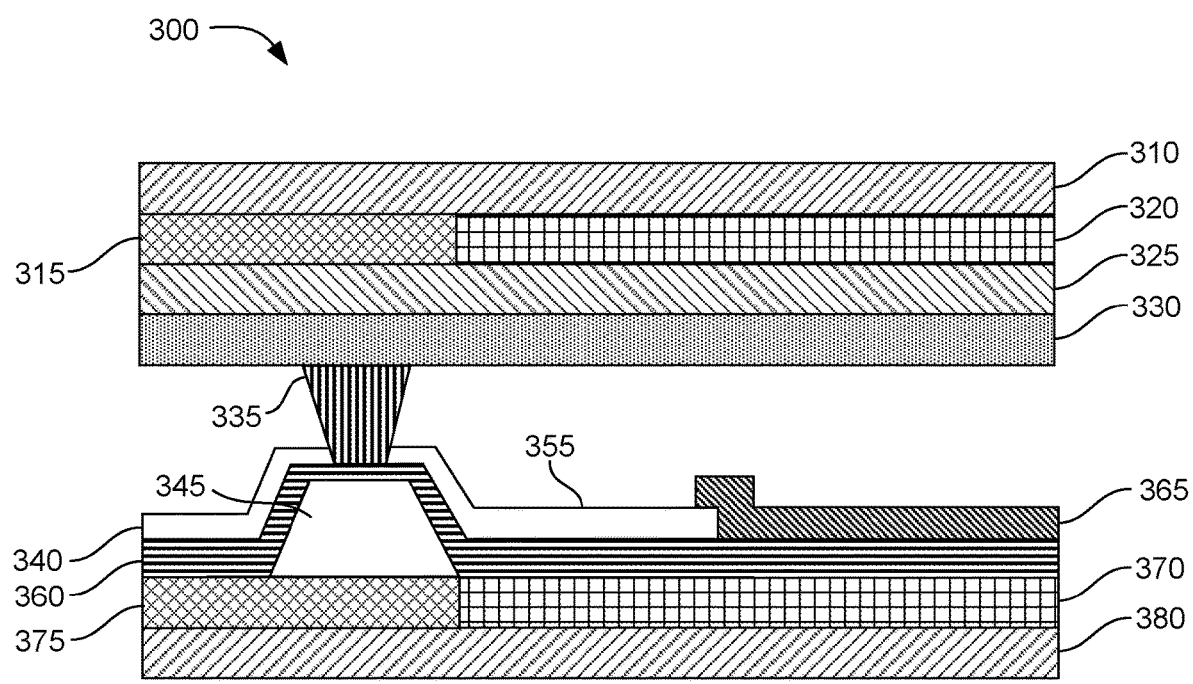
FIG. 3 is a cross-sectional view of an example bendable thin film transistor for an electronic device in accordance with the present disclosure.

FIG. 3 depicts a cross-sectional view of a bendable thin film transistor (TFT) 300. The bendable TFT can be used for a bendable display. The bendable TFT can include a first display region 315 and a second display region 320 as well as an additional first display region 375 and an additional second display region 370. Both first display regions 315 and 375 may be rigid and composed of glass and may have all the same features and capabilities of the first display region 110 of FIG. 1. Both second display regions 320 and 370 may be composed of plastic and be bendable and may have all the same features and capabilities of the second display region 120 of FIG. 1. The first display region 315 and the second display region 320 can form a continuous display panel and can be covered by a color resist layer 310. On a surface opposite of the color resist layer, a color filter layer 325 is formed on a surface of the continuous display panel. The color filter layer may include portions of resin black resist between regions of red, blue and green. On an opposite surface of the continuous display panel, an over coat layer 330 can be formed on the color filter layer. A column spacer 335 can be placed under a portion of the over coat layer. The column spacer separates a drain 340 and a source 355. The source may be partially covered by an ITO layer 365. The drain, column spacer, source and ITO layer may be separated from a gate 345 by an insulating layer 360. The insulating layer may be an organic insulator. The gate may be placed over a surface of the first display region 375. The first display region 375 and the second display region 370 may be covered on an opposite surface by a color resist layer 380.

The first display region 315 and the second display region 320 with the color filter layer 325 and the over coat layer 330 may form a color filter for the bendable TFT 300. The drain 340, the source 355, the gate 345, the insulating layer 360, the ITO layer 365 together with the first display region 375 and the second display region 370 can form a TFT array.

Figure 4:
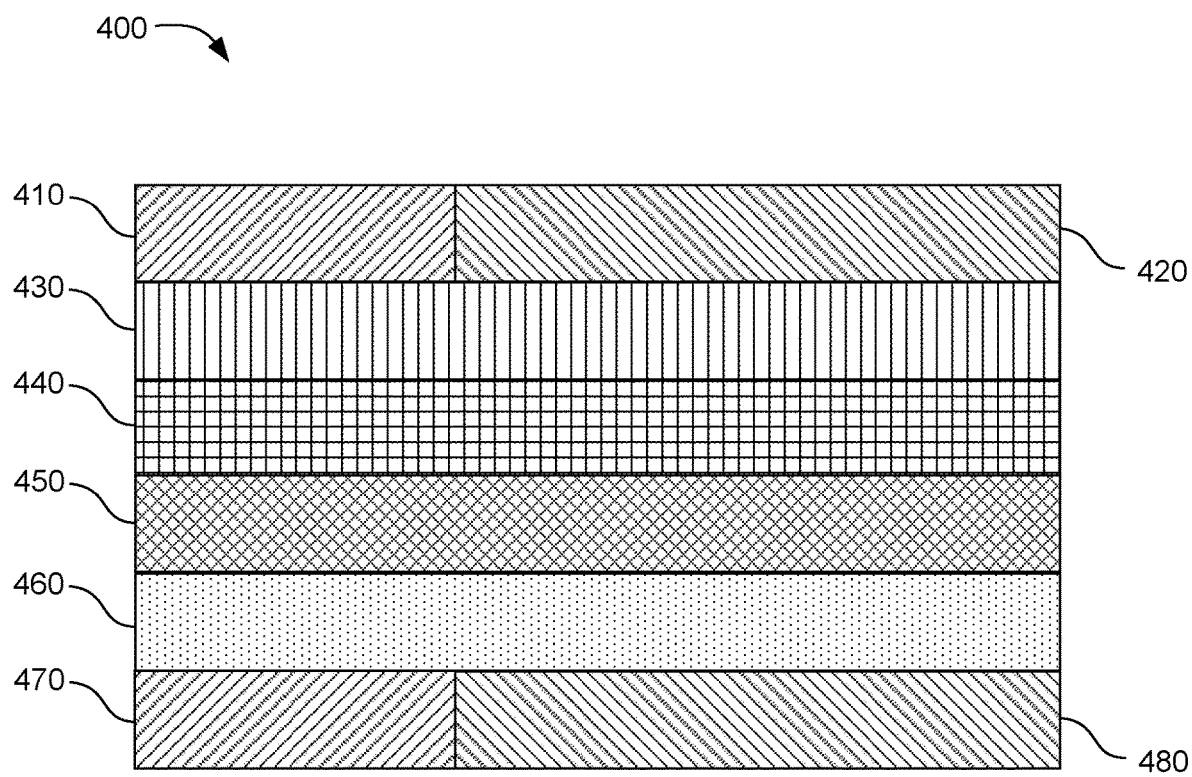
FIG. 4 is a cross-sectional view of an example flexible organic light emitting diode display in accordance with the present disclosure.

FIG. 4 depicts a cross section view of a flexible OLED display 400. The flexible OLED display in this example includes multiple layers with the top most layer being a first display substrate and the bottom most layer being a second display substrate. The first display substrate is composed of a first display region 410 and a second display region 420. The second display substrate is composed of a first display region 470 and a second display region 480. The first display regions and the second display regions of FIG. 4 can have all of the same features and capabilities of the first display region 110 and the second display region 120 of FIG. 1.

The layers between the first and second display substrate of the flexible OLED display 400 can be referred to as an electronic display assembly supported by the display substrates. The electronic display assembly includes a cathode 430 on a surface of the first display substrate. An emissive layer 440 on a surface of the cathode opposite of the first display substrate. A conductive layer 450 on a surface of the emissive layer opposite of the cathode. An anode 460 on a surface of the conductive layer opposite of the emissive layer. The anode can also be a surface of the second display substrate opposite of the conductive layer. The emissive layer and the conductive layer can be formed of organ molecules or polymers. The electronic display assembly can be bendable or flexible in the regions between second display region 420 and second display region 480 to bend with the plastic panels of the display.

Figure 5:
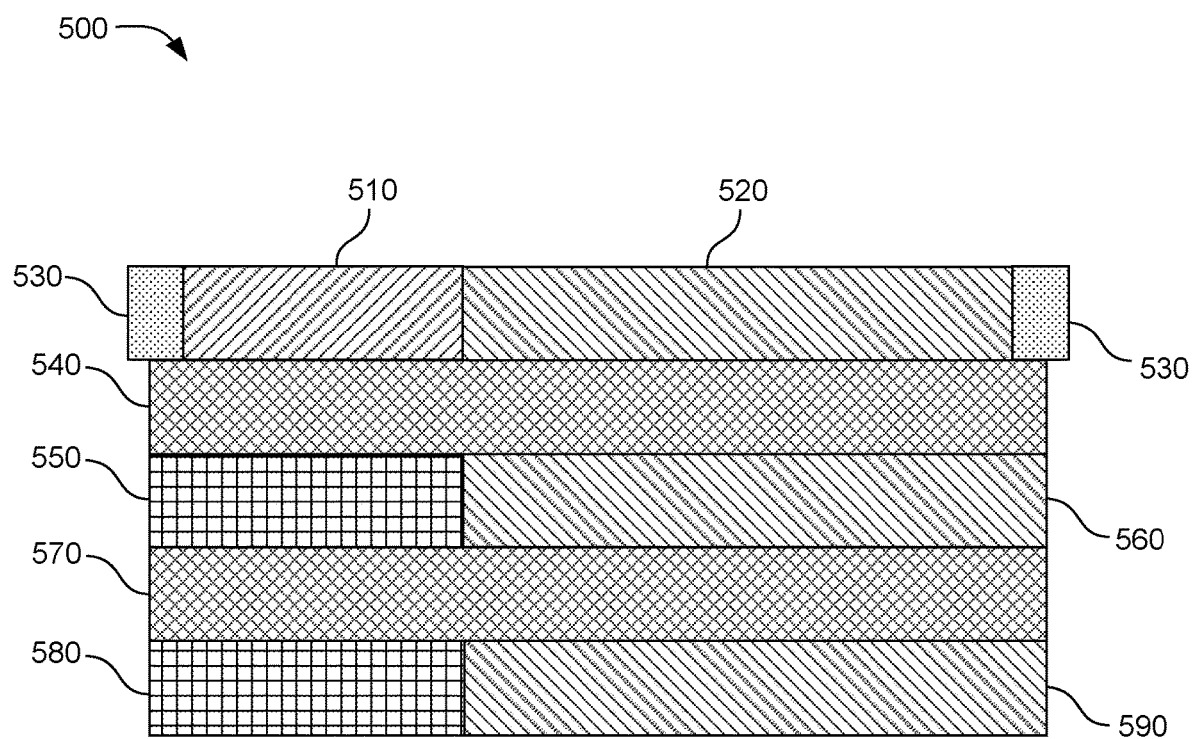
FIG. 5 is a cross-sectional view of an example bendable touch panel in accordance with the present disclosure.

FIG. 5 depicts a cross sectional view of a bendable touch panel 500. The bendable touch panel can include a first display substrate that can include a first display region 510 and a second display region 520. The first display substrate can be encased on either side by a casing 530. The casing may be referred to as a housing or bezel for the bendable touch panel. A portion of the casing may be flexible or able to articulate with the second display region. The first display substrate may be attached to a second display substrate using an adhesive layer 540. The second display substrate can be composed of a first display region 550 and a second display region 560. The second display substrate may be attached to a third display substrate using an adhesive layer 570. The third display substrate can likewise include a first display region 580 and a second display region 590. The first display regions 510, 550, and 580 may have all of the same features and capabilities of the first display region 110 of FIG. 1. The second display regions 520, 560, and 590 may have all of the same features and capabilities of the first display region 120 of FIG. 1. The adhesive layers 540 and 570 may be an optical clear adhesive similar to the adhesive described in reference to FIG. 1. The first display region 510 may be a cover glass layer. The first display region 550 and the first display region 570 may be composed of ITO glass.

Figure 6A:
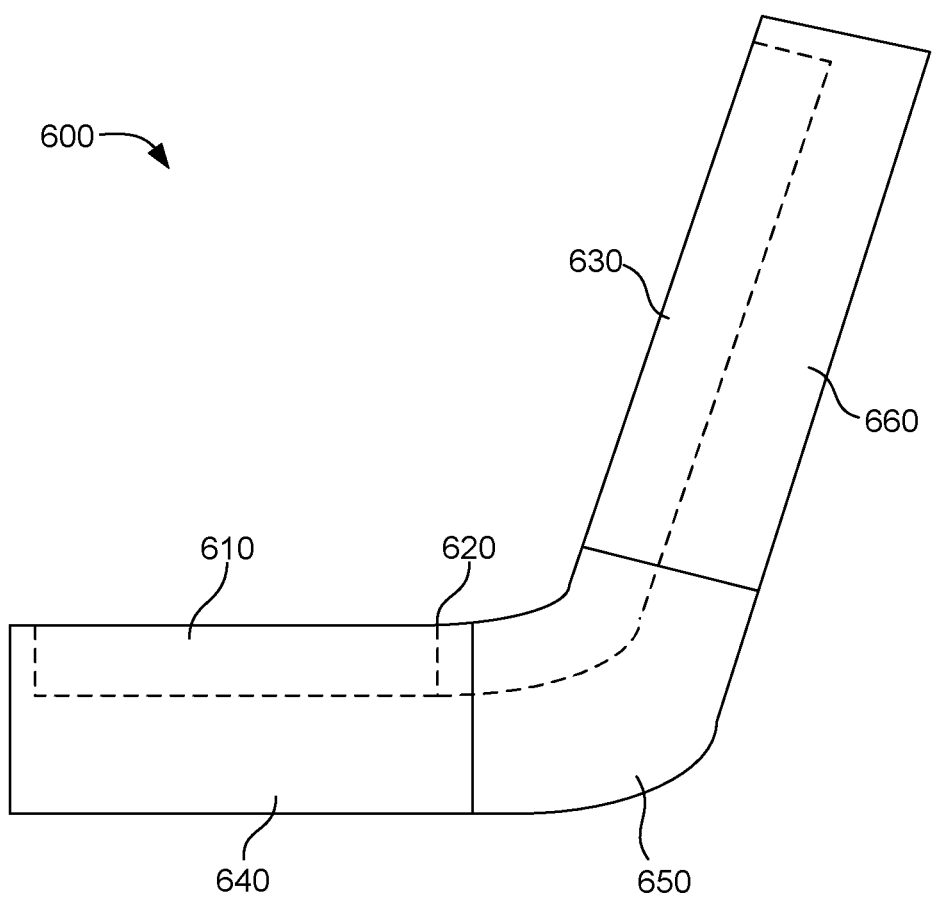
FIGS. 6A-B depict side views of an example bendable electronic device in accordance with the present disclosure.
Figure 6B:
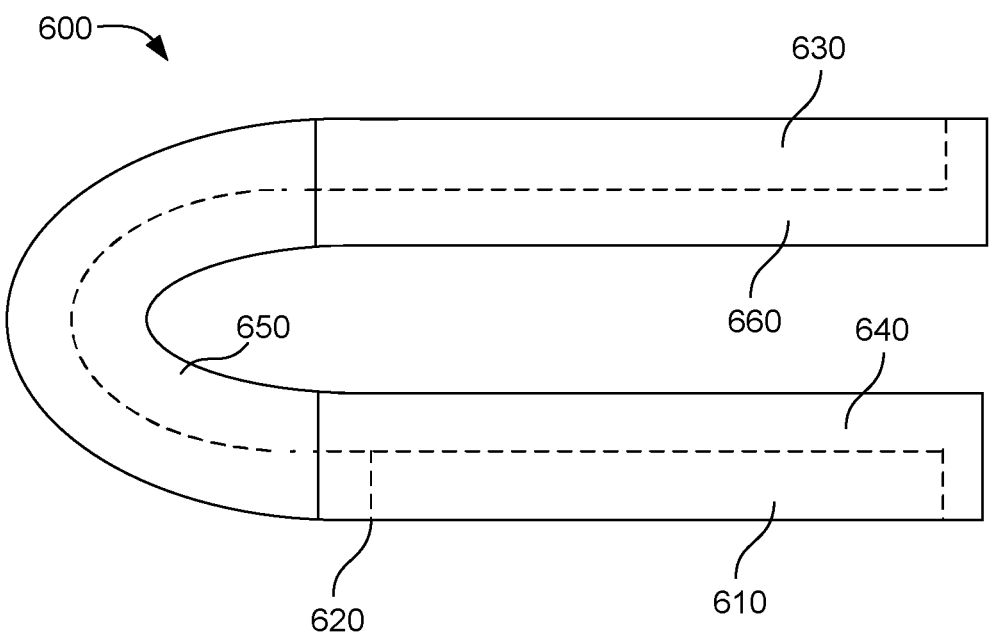

FIGS. 6A and 6B depict side views of an electronic device 600. The electronic device is capable of bending or flexing at a portion of the electronic device. FIG. 6A depicts the electronic device in configuration resembling a laptop where a base 640 of the electronic device rests on a surface and supports an upper portion 660 of the electronic device. The base may be part of the housing or casing of the electronic device and may be rigid. The first display region 610 may include a glass panel and may be rigid. The upper portion may be part of the housing or casing of the electronic device and may be rigid. The second display region 630 may include a plastic panel and may be bendable. The joined respective first and second interlocking edges of the first display region 610 and second display region 630 is shown at reference numeral 620. A portion of the second display region is housed by the upper portion of the housing while another portion of the second display region is housed by a portion of the housing that is either pivotable, or in one example, flexible as a flexible housing 650. The flexible housing can thus be flexible or include an articulating or pivotable portion that allows the housing to bend with the second display region. For example, the flexible housing may allow the electronic device to be bent along a center line of the electronic device. In one example, the electronic device may be constructed such that portions of the housing or casing are rigid and other portions are flexible. In one example, the electronic device may be constructed such that housing or casing is flexible and can be bent anywhere the second display region can be bent.

FIG. 6B depicts the electronic device 600 as being bent such that the first display region 610 is parallel with a portion of the second display region 630 where the first display region and a portion of the second display region are facing in opposite direction. In either the configurations of FIG. 6A or 6B, the electronic device can be placed on a flat surface such as a table top with the first display region parallel to the flat surface. The first display region with the glass panel can provide stability and resist shifting and vibrations while the user interacts with the electronic device.

As used herein, a layer that is referred to as being "on" a lower layer can be directly applied to the lower layer, or an intervening layer or multiple intervening layers can be located between the layer and the lower layer. Accordingly, a layer that is "on" a lower layer can be located further from the top most layer. However, in some examples there may be other intervening layers such as an adhesive layer.

It is noted that when discussing bendable display for electronic devices, the electronic devices themselves, or methods of making bendable display for electronic devices, such discussions can be considered applicable to one another whether or not they are explicitly discussed in the context of that example. Thus, for example, when discussing the first display region with rigid glass panels and the second display region with bendable plastic panel used in the bendable display in the context of one of the example bendable displays, such disclosure is also relevant to and directly supported in the context of the electronic devices and/or methods, and vice versa. It is also understood that terms used herein will take on their ordinary meaning in the relevant technical field unless specified otherwise. In some instances, there are terms defined more specifically throughout or included at the end of the present disclosure, and thus, these terms are supplemented as having a meaning described herein.

Electronic Devices

A variety of electronic devices can be made with the bendable displays described herein. In various examples, such electronic devices can include various electronic components including the bendable display. As used herein, "bendable display" when used with respect to the electronic device is a display that visually displays images or other information to a user. The display can be a touch screen that a user can touch to select objects in a graphical user interface. The bendable display may be bendable or flexible in one region and rigid in another region in accordance with embodiments of the present technology. In further examples, the electronic device can be a laptop, a smartphone, a tablet, a monitor, a television, a video player, or a variety of other types of electronic devices that include a display.

Methods of Making Bendable Displays for Electronic Devices

FIGS. 7A-F depict a process for forming interlocking shapes or structures for the glass panels of the first display regions of the present technology. The process may also be extended to forming interlocking shapes or structures for the plastic panel of the second display region of the present technology.

Figure 7A:
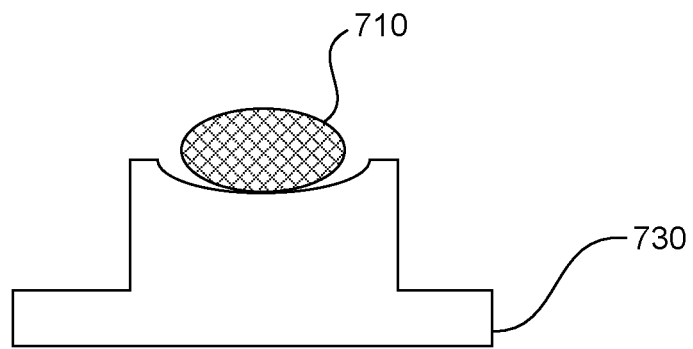
FIGS. 7A-F depict an example process for forming interlocking shapes in accordance with the present disclosure.
Figure 7B:
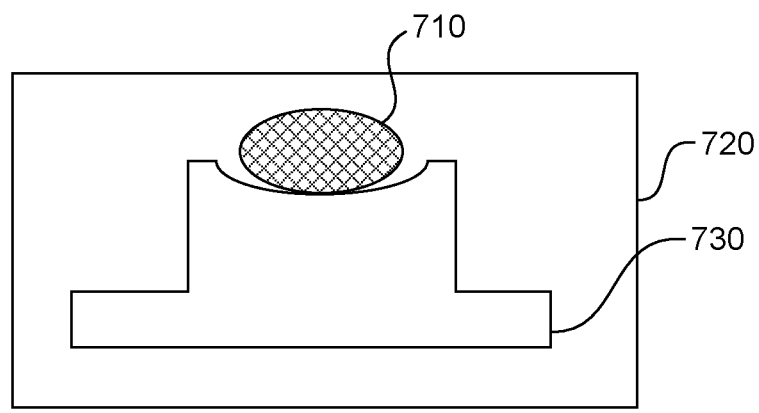
Figure 7C:
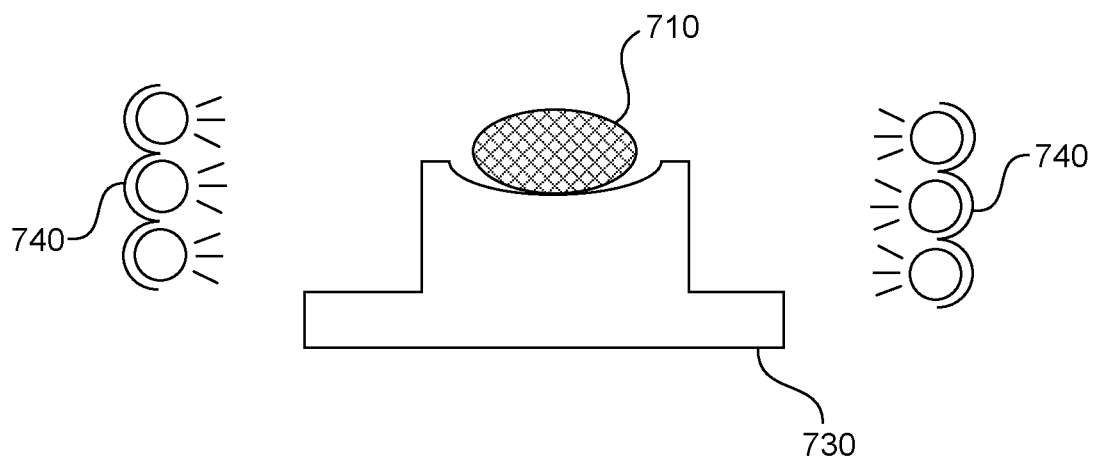
Figure 7D:
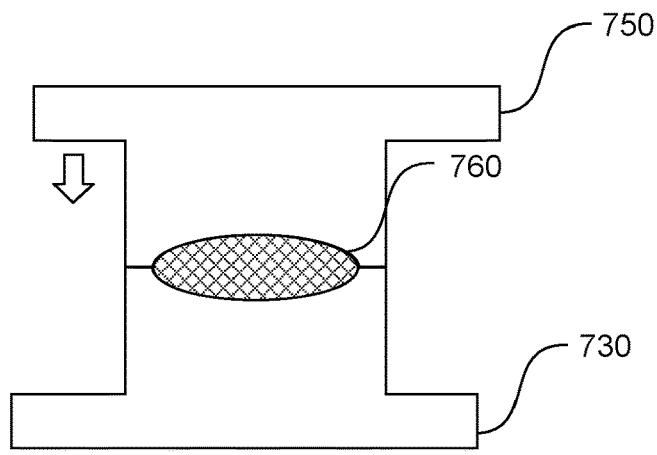
Figure 7E:
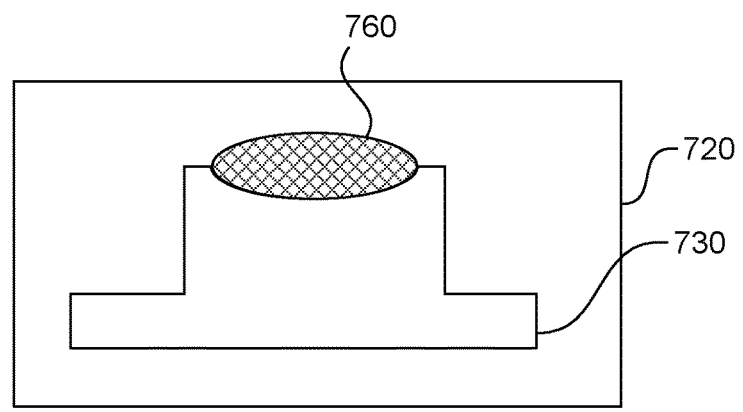
Figure 7F:
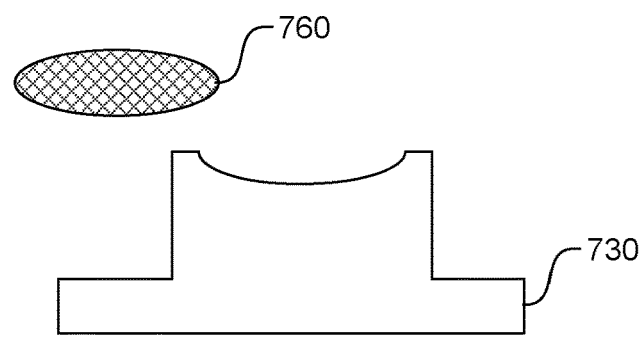

In accordance with examples of the present disclosure, at FIG. 7A, a lower mold 730 can be used to receive a structure 710 with a first shape. The first shape in this example is depicted as semi-oval shape. The structure may be a glass structure or a plastic structure. The structure before shaping or molding may be referred to as a cold blank with a defined geometry. At FIG. 7B a chamber 720 surrounding the mold can be evacuated and an $N_2$ lavage is performed on the chamber and the structure, for example. At FIG. 7C infrared lamps 740 are used to isothermally heat the structure. The structure may be heated from about 550 to about 800 degrees Celsius for a glass structure. The structure may be heated from about 100 to about 300 degrees Celsius for a plastic structure. These temperatures are provided by example and should not be considered limiting. The material properties may instead dictate the temperatures and other processing properties. FIG. 7D depicts an upper mold 750 brought down on the structure and the lower mold to shape the structure into a new structure 760. This may be referred to as travel controlled molding to form the interlock structure. The new structure has different shape than the original structure of the cold blank. FIG. 7E depicts the upper mold being removed and the chamber is cooled with an $N_2$ lavage. FIG. 7F depicts the new structure being removed from the lower mold. The new structure can be in the form of an interlocking shape used along an interlocking edge of the first or second display region.

Figure 8:
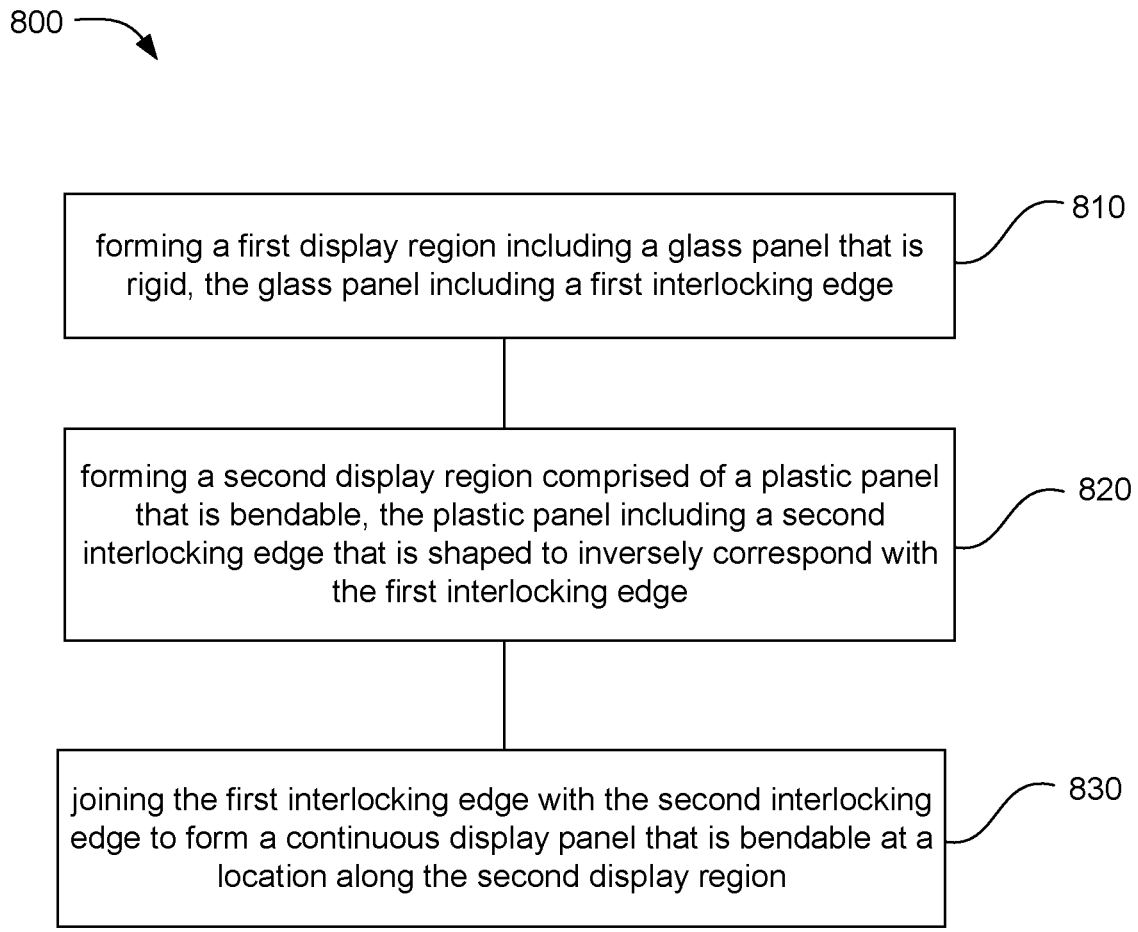
FIG. 8 is a flowchart illustrating an example method of making a bendable display for an electronic device in accordance with the present disclosure.

FIG. 8 is a flowchart illustrating an example method 800 of making a bendable display for an electronic device. The method includes forming 810 a first display region including a glass panel that is rigid, the glass panel including a first interlocking edge, forming 820 a second display region comprised of a plastic panel that is bendable, the plastic panel including a second interlocking edge that is shaped to inversely correspond with the first interlocking edge, and joining 830 the first interlocking edge with the second interlocking edge to form a continuous display panel that is bendable at a location along the second display region.

Definitions

It is noted that, as used in this specification and the appended claims, the singular forms "a," "an," and "the" include plural referents unless the content clearly dictates otherwise.

The term "about" as used herein, when referring to a numerical value or range, allows for a degree of variability in the value or range, for example, within 5% or other reasonable added range breadth of a stated value or of a stated limit of a range. The term "about" when modifying a numerical range is also understood to include the exact numerical value indicated, e.g., the range of about 1 wt % to about 5 wt % includes 1 wt % to 5 wt % as an explicitly supported sub-range.

As used herein, a plurality of items, structural elements, compositional elements, and/or materials may be presented in a common list for convenience. However, these lists should be construed as though the individual members of the list are individually identified as a separate and unique member. Thus, no individual member of such list should be construed as a de facto equivalent of any other member of the same list solely based on their presentation in a common group without indications to the contrary.

Concentrations, dimensions, amounts, and other numerical data may be presented herein in a range format. It is to be understood that such range format is used merely for convenience and brevity and should be interpreted flexibly to include the numerical values explicitly recited as the limits of the range, and also to include all the individual numerical values or sub-ranges encompassed within that range as if individual numerical values and sub-ranges are explicitly recited. For example, a layer thickness from about 0.1 µm to about 0.5 µm should be interpreted to include the explicitly recited limits of 0.1 µm to 0.5 µm, and to include thicknesses such as about 0.1 µm and about 0.5 µm, as well as subranges such as about 0.2 µm to about 0.4 µm, about 0.2 µm to about 0.5 µm, about 0.1 µm to about 0.4 µm etc.

EXAMPLES

The following illustrates examples of the present disclosure. However, it is to be understood that the following is illustrative of the application of the principles of the present disclosure. Numerous modifications and alternative compositions, methods, and systems may be devised without departing from the spirit and scope of the present disclosure. The appended claims are intended to cover such modifications and arrangements.

Example 1

An example bendable display for an electronic device is made as follows:
1) A first display region is made of a glass panel that is rigid. The glass panel has a first interlocking edge that is composed of semi-trapezoid shapes.
2) The semi-trapezoid shapes are formed using molds in a chamber where infrared lamps heat glass structures isothermally and then use travel control molding techniques.
3) A second display region is made of a plastic panel that is bendable. The plastic panel has a second interlocking edge composed of semi-trapezoid shapes that correspond to the first interlocking edge of the first display region.
4) The first interlocking edge of the first display region is joined to the second interlocking edge of the second display region using an optical clear adhesive.
5) The first display region and the second display region form a continuous display panel.
6) The continuous display panel is housed in a casing that is able to articulate along a center line of the electronic device.

Example 2

An example flexible organic light emitting diode display for an electronic device is made as follows:
1) A first display substrate is composed of first display region made with a glass panel that is rigid. The first display region is joined to a second display region made with a plastic panel. The glass panel and the plastic panel are joined using interlocking edges.
2) A second display substrate is composed of first display region made with a glass panel that is rigid. The first display region is joined to a second display region made with a plastic panel. The glass panel and the plastic panel are joined using interlocking edges.
3) An electronic display assembly between the first and second display substrates. The electronic display assembly configured to bend with the plastic panel of the first and second display substrates.
4) The first display substrate is located over the second display substrate such that the glass panel of the first display substrate is over the glass panel of the second display substrate and the plastic panel of the first display substrate is over the plastic panel of the second display substrate.
5) The electronic display assembly is composed of an anode over the second display substrate, a conductive layer over the anode, an emissive layer over the conductive layer, and a cathode over the emissive layer.

Example 3

An example bendable display for an electronic device is made as follows:
1) A first display substrate is composed of first display region made with a glass panel that is rigid. The first display region is joined to a second display region made with a plastic panel. The glass panel and the plastic panel are joined using interlocking edges. The glass panel is a cover glass.
2) The edges of the first display substrate are surrounded by a casing for the electronic device.
3) A second display substrate is composed of first display region made with a glass panel that is rigid. The first display region is joined to a second display region made with a plastic panel. The glass panel and the plastic panel are joined using interlocking edges. The glass panel is composed of ITO glass.
4) A third display substrate is composed of first display region made with a glass panel that is rigid. The first display region is joined to a second display region made with a plastic panel. The glass panel and the plastic panel are joined using interlocking edges. The glass panel is composed of ITO glass.
5) The first display substrate is joined to a surface of the second display substrate using an optical clear adhesive.
6) The second display substrate is joined to the third display substrate along a second surface of the second display substrate opposite of the first display substrate using an optical clear adhesive.
7) The first, second and third display substrates form a touch screen.

What is claimed is:

1. A bendable display for an electronic device comprising:
a first display region including a glass panel that is rigid, the glass panel including a first interlocking edge;
a second display region including a plastic panel that is bendable, the plastic panel including a second interlocking edge that is shaped to inversely correspond with the first interlocking edge; and
an interlock zone where the first interlocking edge is joined with the second interlocking edge such that the first display region and the second display region form a continuous display panel that is bendable at a location along the second display region.

2. The bendable display of claim 1, further comprising:
a display substrate comprising a second glass panel and a second plastic panel joined by a second interlock zone; and
an electronic display assembly supported by the display substrate, the electronic display assembly including a sub-assembly with conductive layer attached to an emissive layer, the electronic display assembly further including a cathode layer and an anode layer positioned on opposing sides of the sub-assembly.

3. The bendable display of claim 2, wherein the glass panel is over a first portion of the electronic display assembly and the plastic panel is over a second portion of the electronic display assembly, and wherein the second portion of the electronic display assembly is also bendable at the location along the second display region.

4. The bendable display of claim 1, wherein the plastic panel is polyethylene terephthalate (PET), polyester, polyethylene naphthalate (PEN), polycarbonate (PC), polyethersulfone (PES), polycyclic olefin (PCO), polyimide (PI), polyarylate, polystyrene, polymethyl methacrylate (PMMA), or a combination thereof.

5. The bendable display of claim 1, wherein the glass panel has a thickness from about 0.1 mm to about 0.8 mm.

6. The bendable display of claim 1, wherein the plastic panel has a thickness from about 10 μm to about 0.8 mm.

7. The bendable display of claim 1, wherein the first interlocking edge or the second interlocking edge has a cross-sectional interlocking shape that is a semi-circle, a semi-triangle, a semi-square, a semi-oval, a semi-trapezoids, a semi-rectangle, a semi-pentagon, a semi-hexagon, or a combination thereof.

8. The bendable display of claim 1, wherein the glass panel is joined to the plastic panel at the interlock zone using an optical clear adhesive.

9. The bendable display of claim 1, wherein the bendable display is a liquid crystal display (LCD) or an organic light emitting diode (OLED) display.

10. The bendable display of claim 1, wherein the bendable display is encased in a cover that is capable of articulating at the location along the second display region.

11. An electronic device comprising:
an electronic component; and
a bendable display electronically integrated with the electronic component, the bendable display comprising:
a first display region including a glass panel that is rigid, the glass panel including a first interlocking edge, a second display region including a plastic panel that is bendable, the plastic panel including a second interlocking edge that is shaped to inversely correspond with the first interlocking edge, and an interlock zone where the first interlocking edge is joined with the second interlocking edge such that the first display region and the second display region form a continuous display panel that is bendable at a location along the second display region.

12. The electronic device of claim 11, wherein the electronic device is a television, monitor, laptop, tablet computer, smartphone, or e-reader.

13. The electronic device of claim 11, wherein the bendable display is a liquid crystal display (LCD) or an organic light emitting diode (OLED) display.

14. A method of making a bendable display for an electronic device comprising:

forming a first display region including a glass panel that is rigid, the glass panel including a first interlocking edge;

forming a second display region comprised of a plastic panel that is bendable, the plastic panel including a second interlocking edge that is shaped to inversely correspond with the first interlocking edge; and joining the first interlocking edge with the second interlocking edge to form a continuous display panel that is bendable at a location along the second display region.

15. The method of claim 14, further comprising forming the first interlocking edge, the second interlocking edge, or both by isothermal heating using an infrared lamp and travel control molding in a chamber.

\* \* \* \* \*